United States Patent [19]

Grünewald et al.

[11] Patent Number: 4,779,051
[45] Date of Patent: Oct. 18, 1988

[54] COUPLING UNIT FOR THE OPERATIVE MONITORING OF THE HIGH-VOLTAGE WINGINGS AND THE CONNECTED OUTPUT LEADS IN ELECTRIC HIGH-VOLTAGE MACHINES AND APPARATUS, BY MEANS OF PARTIAL DISCHARGE DETERMINATION AND BREAKDOWN SPARK MEASUREMENT

[75] Inventors: Peter Grünewald, Essen; Reinhold Koziel, Mülheim, both of Fed. Rep. of Germany

[73] Assignee: Kraftwerk Union Aktiengesellschaft, Mülheim, Fed. Rep. of Germany

[21] Appl. No.: 33,156
[22] PCT Filed: Dec. 16, 1985
[86] PCT No.: PCT/DE85/00527
  § 371 Date: Feb. 13, 1987
  § 102(e) Date: Feb. 13, 1987

[30] Foreign Application Priority Data
Jun. 15, 1985 [DE] Fed. Rep. of Germany ....... 3521576
Jul. 22, 1985 [DE] Fed. Rep. of Germany ....... 3526149

[51] Int. Cl.$^4$ .............................................. G01R 31/32
[52] U.S. Cl. ............................ 324/536; 324/158 MG
[58] Field of Search ............... 324/158 MG, 158 SR, 324/158 SY, 511, 536, 541, 544, 519

[56] References Cited

PUBLICATIONS

Wilson et al.; IEE Proceedings, vol. 132, Pt. B, No. 5, Sep. 1985, "Discharge Detection Techniques for Stator Windings," pp. 234–244.
Nieschwietz et al.; "Teilentladungsmessungen an Hochspannungstransformatoren als Mittel der Qualitäks Kontrolle", Qualitäkskontrolle on Hochspannungs Transformatoren, etz–a Bd. 97 (1976) Hill, pp. 657–663.
IEEE Transactions on Power Apparatus and Systems; vol. PAS-98, No. 5, Sep./Oct. 1979, IEEE, New York (U.S.) M. Kurtz et al.: "Generator Insulation Diagnostic Testing", pp. 1596–1603; bottom of p. 1596, left col., line 38—p. 1596, right col., line 4; Figure 2.
Patents Abstracts of Japan, vol. 7, No. 282 (P-243) (1427) Dec. 16, 1983, & JP-A-58-158569 (Tokyo Shibaura Denki K.K.) Sep. 20, 1983.
Patents Abstracts of Japan vol. 7, No. 247 (E-208) (1392) Nov. 2, 1983 & JP-A-58-133143 (Tokyo Shibaura Denki K.K.) Aug. 8, 1983.
Siemens-Energietechnik 6 (1984) Issue 6, pp. 286–289 "Wicklungsüberwachung von elektrischen Maschinen durch Hochfrequenz-Messverfahren.

Primary Examiner—Reinhard J. Eisenzopf
Assistant Examiner—Anthony L. Miele
Attorney, Agent, or Firm—Herbert L. Lerner; Laurence A. Greenberg

[57] ABSTRACT

Coupling unit for the operational monitoring of the high-voltage winding (SW) and the connected electric output lines in electric high-voltage machines and apparatus, particularly of three-phase stator windings in turbo-generators including their generator output lines (5.1, 5.2, 5.3) and/or in transformers and converters by means of determining partial discharges and measurement of the breaking spark in the high-frequency range, where the above-mentioned machines and apparatus are connected via generator output leads or other connecting line to each other and are connected to ground potential via network protection capacitors. The respective coupling unit (AE1, AE2, AE3) is coupled to one each of the three legs (5.1, 5.2, 5.3) of the generator output lead (5), and the network protection capacitor ($C_1$, $C_2$, $C_3$) of each phase are connected to ground potential (B) via a measuring impedance. Furthermore, the shielded measuring lines (4.1, 4.2, 4.3) brought from the measuring voltage terminal of the measuring impedance to the partial discharge measuring device, are conducted through a filter.

6 Claims, 5 Drawing Sheets

COUPLING UNIT FOR THE OPERATIVE MONITORING OF THE HIGH-VOLTAGE WINGINGS AND THE CONNECTED OUTPUT LEADS IN ELECTRIC HIGH-VOLTAGE MACHINES AND APPARATUS, BY MEANS OF PARTIAL DISCHARGE DETERMINATION AND BREAKDOWN SPARK MEASUREMENT

BACKGROUND OF THE INVENTION

1. Field of the Invention

The invention relates to a coupling unit for the operative monitoring of the high-voltage windings and the connected electric output leads in electric high-voltage machines and apparatus, according to the preamble of claim 1.

2. Description of the Related Art

Such a coupling unit is known in principle, as will be explained in greater detail further on referring to FIG. 1. The stator winding of the turbo-generator comprises here a transformer connected between the common Y-point of the winding and ground potential, a low impedance winding of the transformer or an additional high frequency transformer being connected as a measuring impedance. This known coupling unit and the corresponding measuring method are not sensitive enough; it is impossible to discriminate between the individual phases of the high-voltage winding. Although partial discharges in the high voltage insulation of the winding as well as breaking spark currents in the case of possible conductor interruptions or between winding bars and lamination stacks are surge currents of short duration and pulse-like shape, which are easy to determine by high frequency measuring methods the known coupling unit is not yet satisfactory as far as its sensitivity, in particular with respect to partial discharges on the side of the generator output leads.

SUMMARY OF THE INVENTION

It is an object of the invention to provide a coupling unit improved over this, of which the partial discharge measuring signals called TE measuring signals for short in the following, can be correlated with certainty to the individual phases of the stator winding and which reacts more sensitively also to TE measuring signals which have their origin on the side of the generator output leads, so that in certain cases also fault signals from the connected machine transformer can be received. The coupling unit should be usable for different test objects such as model samples, portions of windings or running turbo generators and be independent of the existence of a Y-point of the stator winding.

According to the invention, the stated problem is solved with a coupling unit for operational monitoring of the high-voltage windings and their thereto-connected output leads in electric high-voltage machines and apparatus, especially of the three-phase stator winding in the turbo-generators including their generator output leads and/or in transformers and converters by means of determining partial discharges and breakdown spark measurement, wherein the above-mentioned machine and apparatus are connected together via generator output leads and are connected to ground via network protection capacitors, wherein the coupling unit is coupled selectively to one each of the three legs of the generator output lead, wherein for said purpose the network protection capacitors for each phase are connected via a respective measuring impedance to ground potential, and wherein the shielded measuring lines leading from the measuring voltage terminal of the measuring impedance to the partial discharge measuring device are conducted through a filter.

The advantages attainable with the invention are in particular that the determination of winding defects is made possible for each individual phase of the stator winding of an electric high-voltage machine in general and of a turbo-generator in particular, and also the sensitivity, i.e. the signal to noise ratio is improved. The coupling unit is well suited for installation as a retrofit unit in existing power generation plants as well as in the context of new manufacture. Due to the high sensitivity it contributes substantially to an early damage or fault detection in large electrical machines because, for instance, winding defects generate through the interruption of partial conductors, a discontinuation of potential controls or discharges due to the motion of the conductors in the slot, high-frequency sparks or partial discharges. By continuously monitoring the TE measurement signals during operation, the generation of major insulation defects which lead to expensive secondary damage such as shorts to ground with damage to the lamination stacks are avoided.

The invention will be explained in greater detail in the following, making reference to the drawing in which the basic block diagram of a known coupling unit, subsequently an embodiment example of the invention and finally measurement results obtained with the coupling unit according to the invention are shown.

In accordance with a further feature of the invention, the above-described coupling unit includes a normally open ground-disconnect switch which is connected to a shunt to the measuring impedance.

In accordance with still a further feature of the invention, the hereinabove described coupling unit includes an overvoltage arrester and an electric breakdown fuse connected in parallel to aforesaid shunt circuit consisting of the measuring impedance and the ground-disconnect switch.

In accordance with again another feature of the invention, the above-described measuring line is a shielded coaxial cable conducted via the contact gap of a coaxial relay, wherein the contact gap includes at least one double-throw switch having a make contact, of which the double throw switch makes a connection, in measuring operation between the measuring line and the measuring voltage terminal of the measuring impedance, and can be connected, when the measuring line is taken out of operation, to a grounding contact, while the make contact connects the measuring line to ground potential when it is taken out of operation, and is open during measuring operation.

In accordance with again an additional feature of the invention, the above-described coupling unit has one or more, and in particular three mutually series-connected network protection capacitors for each generator output lead, of which two capacitors are arranged by means of high voltage insulators at a higher level and are connected directly to the generator output leads, or are connected together, and of which the third one is arranged at a lower level or closely above the floor of the high voltage cell which has an accessible front side and can be connected to ground potential via the grounding disconnect switch, wherein the third protection capacitor is supported by means of a plate made of an insulating material; and including a metallic, grounded mounting plate of the coupling unit, mounted on a support structure, serving for fastening or installing the measuring resistor, the overvoltage arrester, the breakdown fuse, the coaxial relay and the connecting switching and connecting lines.

In accordance with a concomitant feature of the invention, in the coupling unit described above, the coaxial measuring line and the switching line for actuating the coaxial relay are brought from the coaxial relay through an insulating tube to a connecting jack at the boundary grid on the front side of the high-voltage cell.

DESCRIPTION OF THE PREFERRED EMBODIMENTS

Figure 1:
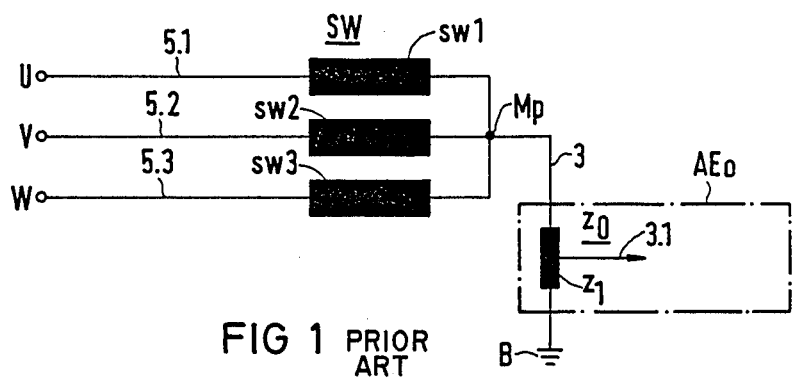
FIG. 1 shows the basic block diagram of a known coupling unit as already mentioned at the outset.

The stator winding of a turbo-generator shown in FIG. 1 and designated generally as SW comprises three winding phases sw1, sw2 and sw3, of which the winding leads or generator output terminals are designated in detail with U or V or W. On the side of the stator winding SW facing away from the generator terminals U, V, W, the individual winding phases are tied together in a common Y-point or central point Mp, from which a common grounding line 3 is connected via a Y-point choke $z_o$ and measuring impedance $z_1$ connected thereto to ground potential B. 3.1 is the measuring voltage connection of the measuring impedance $z_1$, to which a TE measuring line shielded as a high frequency line is connected and is brought to a TE measuring device not shown in detail in FIG. 1, which is symbolized by the arrow. The TE measuring device of this coupling unit, which is known and designated generally as $AE_o$, cannot distinguish on the basis of this circuit from which of the individual phase windings sw1, sw2 or sw3 the TE measuring signals indicating an insulation defect, come.

Figure 2:
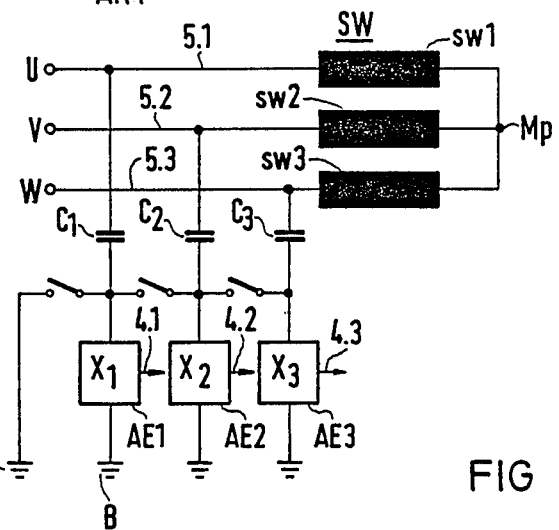
FIG. 2, is a basic block diagram of a coupling unit according to the invention with coupling quadrupoles shown schematically for passing on the TE measuring signals to a TE measuring device (now shown here)

In FIG. 2, the coupling unit according to the invention is shown in principle analogously to the presentation of FIG. 1. This also involves a coupling unit for the operational monitoring of the winding (which also includes the testing of model samples and parts of the winding) and at least of the electric high voltage machines connected to the output lines, especially of the three-phase stator windings SW of turbo generators with the individual phase windings sw1, sw2 and sw3, which are also here tied together at one winding end to form a Y-point Mp. At the other end of the phase windings, the generator output leads associated with the individual phases U, V, W are designated with 5.1, 5.2 and 5.3 (in the same manner as in FIG. 1). While, however, in the circuit diagram according to FIG. 1 these generator leads 5.1 to 5.3 are connected indirectly, i.e. via the individual phase windings sw1 etc and the Y-point choke $z_o$ to ground potential, the generator leads 5.1 to 5.3 are connected in the circuit according to FIG. 2 directly via their network protection capacitors $C_1$, $C_2$, $C_3$, i.e. separately for each individual phase U, V, W to ground potential B and include specifically each HF a respective coupling quadrupole $x_1$, $x_2$ and $x_3$. These coupling quadrupoles with the TE measuring lines 4.1, 4.2, 4.3 going out from them each belong to a coupling unit AE1, AE2, AE3 specific for each phase, where the separate TE measuring lines 4.1 to 4.3 lead to a TE measuring device, also not shown in detail in FIG. 2.

The basic idea of the invention can therefore be seen already from FIG. 2: the coupling units AE1, AE2, AE3 are specific as to phase, i.e. they are coupled selectively to one each of the legs 5.1, 5.2 and 5.3 of the generator output 5. For this purpose, the network protection capacitors $C_1$ to $C_3$ of each phase are connected via a measuring impedance to ground potential B (the measuring impedance is contained in the coupling quadrupoles $X_1$ to $X_3$, respectively). Finally, the shielded measuring lines 4.1 to 4.3 which are brought from the measuring voltage terminal of the respective measuring impedance to the TE measuring device are conducted via a filter (the latter is not shown in detail in FIG. 2 but is conceived as a series-connected device for a partial discharge measuring device).

Figure 3:
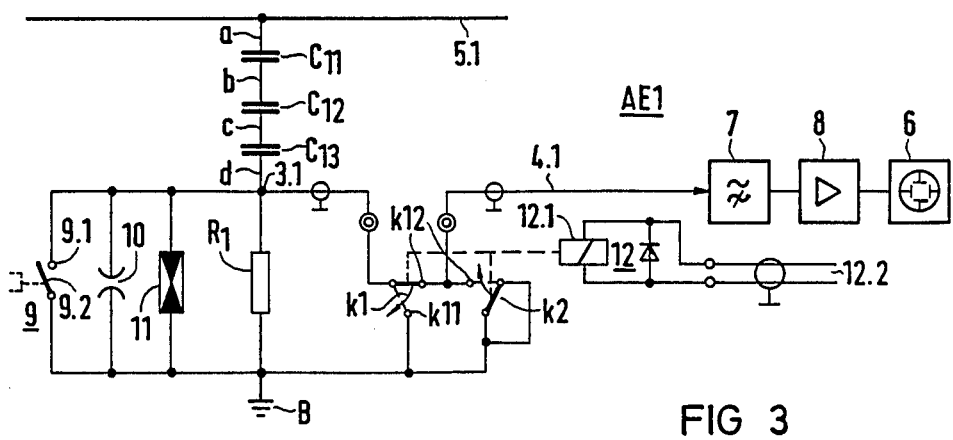
FIG. 3, is a circuit diagram of the coupling unit according to FIG. 2 and is a more detailed than circuit diagram FIG. 2, for a single winding phase of the corresponding turbo-generator.

FIG. 3 shows in greater detail an individual phase U of the generator output 5.1 the circuit diagram of a phase-specific coupling unit which is designated here generally as AE1. The network protection capacitor $C_1$ from FIG. 2 is divided up here into three mutually series-connected network protection capacitors $C_{11}$, $C_{12}$ and $C_{13}$. This series circuit is connected to ground potential B via the measuring impedance $R_1$. It will also be seen that the shielded TE measuring lines 4.1 which are brought from the measuring voltage terminal 3.1 of the measuring impedance $R_1$ to the TE measuring device 6 are conducted via a filter 7 and in addition via a measuring amplifier 8. The filter can be wide band which suppresses only the network interference level, or a high pass filter if a certain frequency spectrum is to be examined in detail. Parallel to the measuring impedance $R_1$ is connected a normally open ground disconnect switch 9 with its fixed contact 9.1 and its movable disconnect blade 9.2. Parallel to the shunt circuit consisting of the measuring impedance $R_1$ and the ground disconnect switch 9, an overvoltage arrester 10 and an electric breakdown fuse 11 are connected. The ground disconnect switch is closed if the coupling unit AE1 is not in operation. The overvoltage arrester 10 and the breakdown fuse 11 protect the measuring impedance $R_1$ against destruction in case that transient overvoltages (for instance due to lightning strikes) might arrive from the outside via the generator leads 5.1.

The measuring line 4.1 (see in this connection the symbols not definitely designated in FIG. 3) which is realized as a shielded coaxial table is conducted via a contact gap of a coaxial relay 12. The contact gap comprises at least one double throw switch k1 and a make switch k2, of which the double throw switch k1 establishes, in the measuring operation as shown, a connection between the measuring line 4.1 and the measuring voltage terminal 3.1 of the measuring impedance $R_1$. The double throw switch k1 can be connected to a grounding switch k11 if the measuring line 4.1 is taken out of operation. Shown is the connection of the double throw switch k1 with a mating switch k12 of the measuring line. During measuring operation, the make switch k2 is open as shown; in this process it shorts itself, and, when taken out of operation, it connects the associated mating contact k12 of the measuring line 4.1 to ground potential. The relay coil is designed with 12.1; the functional connection of the relay armature, not shown in detail, with the double throw and make contacts is indicated by dashed lines. The shielded switching line is designated with 12.2.

Figure 4:
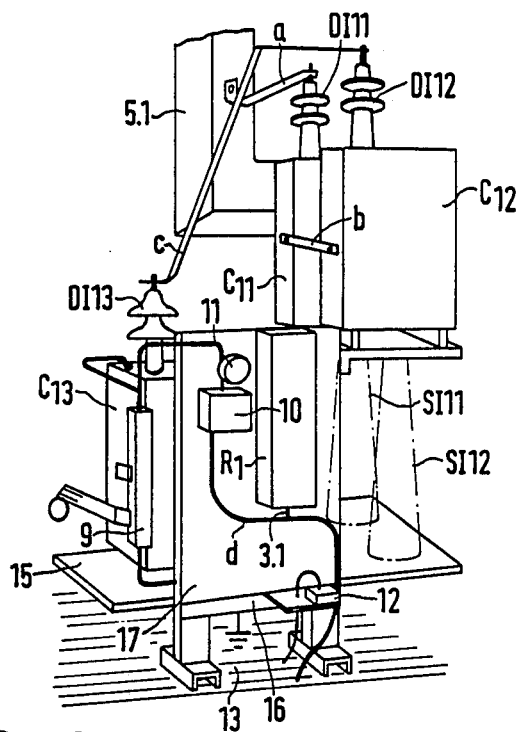
FIG. 4, is a schematic isometric presentation of the coupling unit for a single phase according to FIG. 3 in its physical relationship to the generator output leads.

FIG. 4 shows a physical arrangement according to the circuit diagram, advantageously according to the physical realization and the number of network protection capacitors used, i.e. the individual switching elements and lines according to FIG. 3 which are provided with the same reference symbols in FIG. 4. Subsequently, the connecting lines of the network protection capacitors $C_{11}$ to $C_{13}$ are designated in the order from the generator output lead 5.1 to the connection to the measuring impedance $R_1$ with a to d in FIG. 3 and likewise in FIG. 4. Of the three network protection capacitors according to FIG. 3, two, namely $C_{11}$ and $C_{12}$ are arranged via high voltage support insulators $SI_{11}$ and $SI_{12}$, indicated by dashed lines, at a physically higher level, referenced to the floor level 13 of the associated high voltage cell. The network protection capacitor $C_{11}$ is connected via bus bars a directly to the generator output lead 5.1. The feedthrough insulators for the high potential carrying capacitor terminals are designated with DI 11 and DI 12, respectively. The other pole of the capacitor $C_{11}$ is brought to the housing of the adjacent capacitor $C_{12}$ via a housing switching connection b. From $C_{12}$, the high potential capacitor terminal goes through the feedthrough insulator DI 12 and subsequently as a bus bar connection c to the third network protection capacitor $C_{13}$, i.e. to its high-potential capacitor terminal which is surrounded by the feedthrough insulator DI 13. The other pole of this lower network protection capacitor $C_{13}$ is connected to its housing and is installed as a switching connection line d (see FIG. 3) to the measuring voltage terminal 3.1 of the measuring impedance $R_1$. The third network protection capacitor $C_{13}$ is therefore arranged at a lower level than the other two capacitor $C_{11}$, $C_{12}$, and more specifically shortly above the floor level 13 of the high voltage cell 14 (see FIG. 5), which has an accessible front side 14.1, which is customarily blocked from access from the outside by a wire screen. The third and lowest network protection capacitor $C_{13}$ is supported by means of a sheet of insulating material 15, so that there is no direct connection to ground from its housing to the lower floor level 13. A metallic grounded mounting plate 17, especially an aluminum plate with a thickness of about 20 to 30 mm, of the coupling unit AE1 is mounted on a support frame (indicated at 16) in a substantially vertical position pointing with its flat side in the front direction of the high voltage cell 14 and in front of the third protection capacitor $C_{13}$ and in front of its insulating plate 15. On the front side of this mounting plate 17, the measuring resistor $R_1$, the overvoltage arrester 10, the breakdown fuse 11, the coaxial relay 12 and the connecting switching and connecting lines, respectively, are fastened or installed.

Up to now it has not been explained in detail that the network protection capacitors shown have a box-like or prismatic sheetmetal housing, which, however, goes without saying. However, the invention is not limited to such NSK-Ao (=network protection capacitor arrangements); these can also be designed cylindrically and with a plastic jacket.

Figure 5:
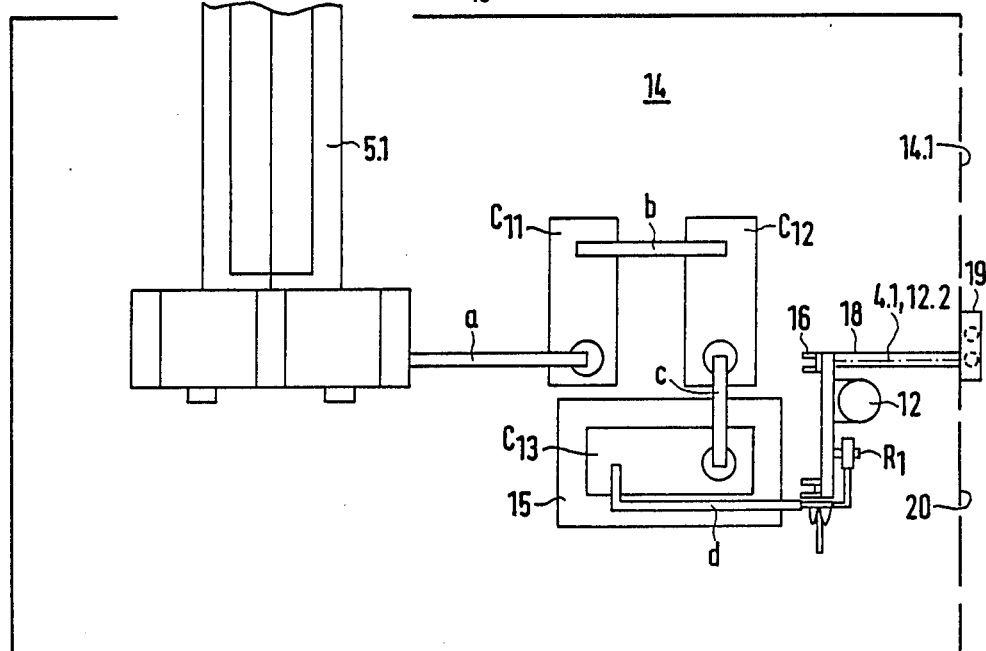
FIG. 5, is a top plan view of onto the high-voltage cell of a single generator lead with three network protection capacitors and the coupling unit.

It will be seen from the top view of FIG. 5 that within the high-voltage cell 14, the coaxial measuring line 4.1 and a switching line, not shown in detail (12.2 in FIG. 3) is brought from the coaxial relay 12, for actuating the coaxial relay 12, through an insulating tube 18 to a connecting jack arrangement 9 at the frontal boundary grid 20 of the high voltage cell 14. In the embodiment example shown, the measuring resistor $R_1$ had an impedance of 50 ohms; it was designed for a bandwidth between 0 and 250 MHz and for a continuous power rating of 300 W or a power of 1 kW for a maximum duration of one minute. The detailed type designation of the measuring resistor $R_1$ is WELZ CT 300. The coaxial relay was of the type CX-520 D; it has a switching capacity of 300 W. The power characteristic of the over voltage arrester 10 are 40 A/20 kV. The insulating material plate 15 of the lower network protection capacitor $C_{13}$ is realized as a hard fiber glass fabric plate. It is supported over a large surface by supports, not shown in detail.

Figure 6:
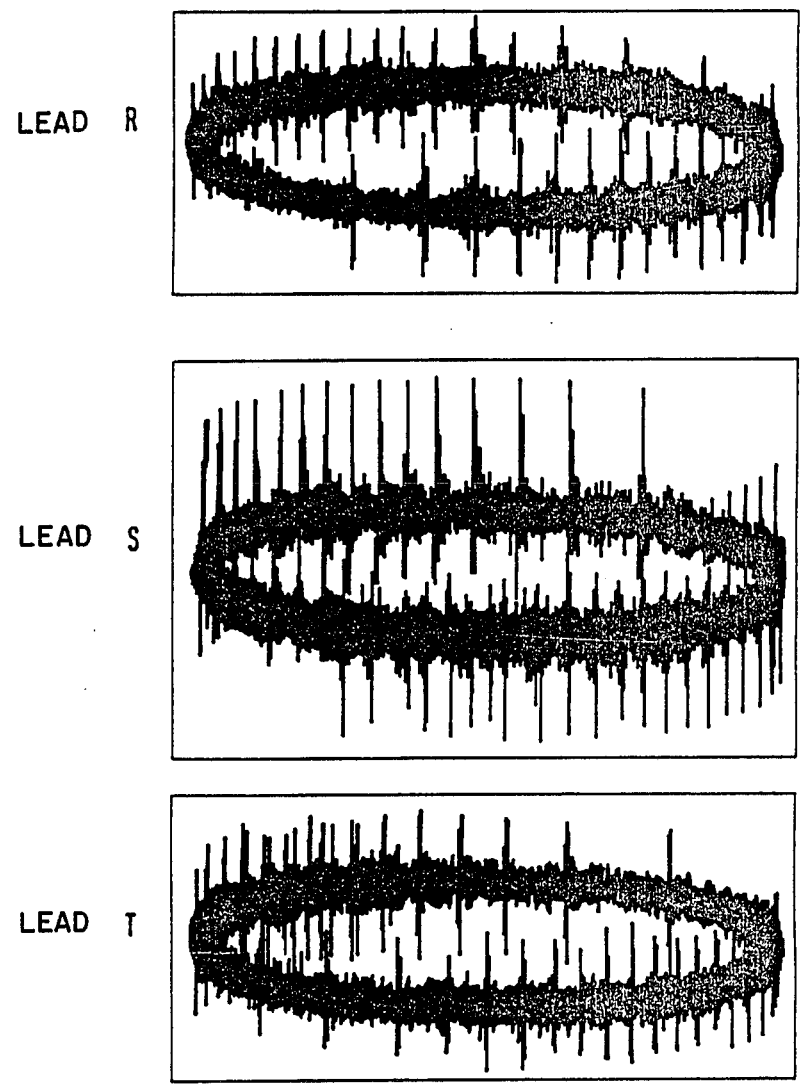
FIG. 6 is a diagrammatic presentation of the partial discharge and breakdown spark levels measured in a wide band HF interference voltage measurement measured via the coupling quadrupoles in the operation of a turbo-generator at nominal power specifically showing in detail the 50-Hz fundamental frequency shown against an elliptical time axis, of the three conductors or generator leads R, S and T with a uniform impressed base interference level of the partial discharges, onto which high breakdown spark pulses are superimposed which appear particularly large on the conductor S.
Figure 7:
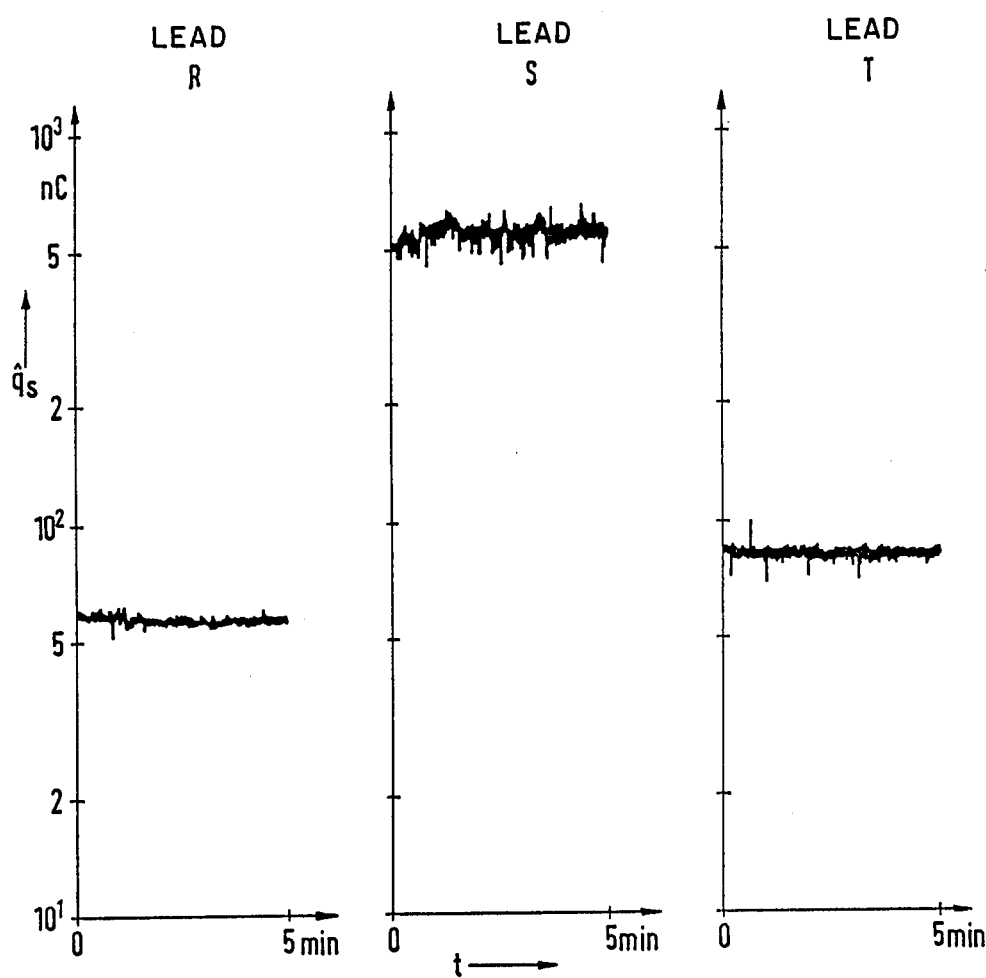
FIG. 7, is a diagrammatic view similar to FIG. 6, but wherein the maximum apparent charge $q_s$ in nC (Nano-Coulombs) of the breakdown spark pulses for the three conductors versus time is shown in minutes.
Figure 8:
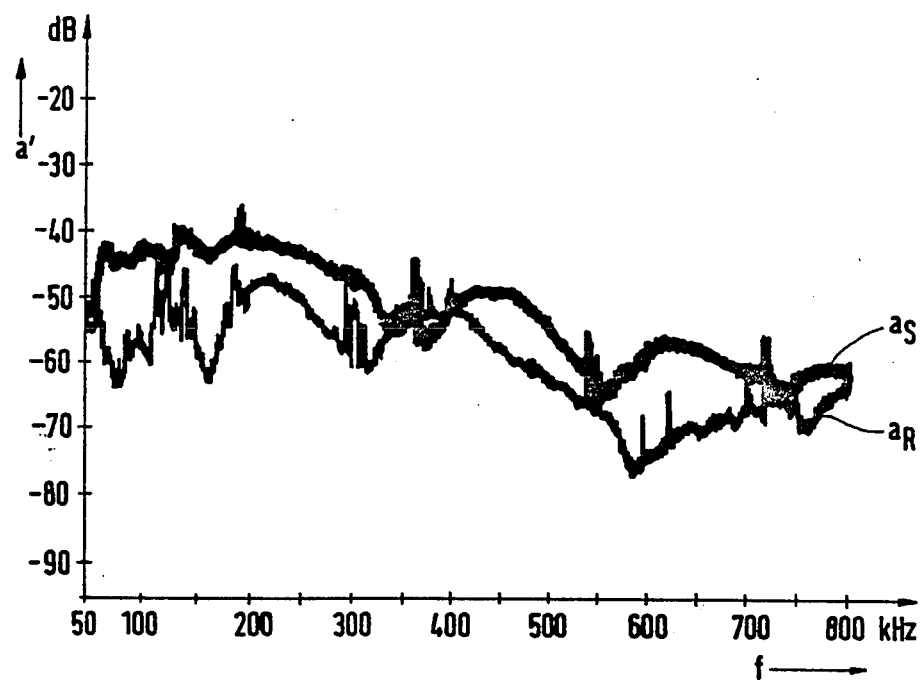
FIG. 8 is a diagrammatic presentation of the TE measurement curves $a_R$ and $a_S$ of the conductors R and S obtained with a narrow-band level measuring instrument in the range between 50 kHz and 800 kHz, showing a so-called amplitude frequency spectrum (amplitudes a' versus frequency f), where the scale on the ordinate is given in dB (=decibel) and on the abscissa, in kHz.

The HF interference levels measured by each coupling unit according to the invention on the three generator leads R, S and T of a 300 MW power generation block in operation are shown in FIGS. 6 to 8. Distinctly higher interference levels are seen, caused by a defect in one of the high voltage windings of equipments connected to conductors or the output lead S, by the wide band measurement in FIGS. 6 and 7 as well as by narrow band measurement in FIG. 8. By successive switching off of the generator, of the machine transformer and of converters, a comparison of the amplitude-frequency spectra in the region of maximum level differences between conductors R or T and conductor S resulted in the following table:

| MAXIMUM LEVEL DIFFERENCES | |
|---|---|
| f (kHz) | $a_S - a_R$ (dB) |
| 80 | 18 |
| 160 | 20 |
| 580 | 17 |

Further details for working with partial discharge measuring equipments, an explanation of which would lead too far for the scope of this application, can be found in the paper "Monitoring of Windings of Electric Machines by High Frequecy Measuring Methods" by Peter Grünewald, Jürgen Weidner and Arnold Wichmann, published in the journal "Siemens-Energietechnik" 6 (1984), No. 6 on pages 286 to 289 with further literature references [1] to [9].

We claims:

1. A coupling unit for operational monitoring of high voltage windings and connected electric output leads in electric high-voltage machines and apparatus, said machines and apparatus having at least one phase lead, divided into high voltage cells each having a floor, including stator windings in turbo-generators, generator, transformer, and converter output leads; wherein said coupling unit monitors by means of determining partial discharges and breaking spark measurement, the above-mentioned phase lead is connected to ground potential via a respective network protection capacitor, the coupling unit is coupled selectively to the phase lead and said network protection capacitor is connected at one side to a respective phase lead and at the other side to a measuring voltage terminal; said coupling unit comprising at least one measuring impedance connected at one side to said measuring voltage terminal, and at the other side to ground potential; a partial discharge measuring device;

at least one filter; and at least one shielded measuring line leading from the measuring voltage terminal through said filter to said measuring device.

2. Coupling unit according to claim 1, including a normally open ground-disconnect switch connected in shunt with the measuring impedance.

3. Coupling unit according to claim 2, including a shunt circuit formed of the measuring impedance and the ground-disconnect switch, and an electric breakdown fuse connected in parallel to the shunt circuit.

4. Coupling unit according to claim 3 wherein the measuring line is realized as a shielded coaxial cable; including a coaxial relay having at least two switches which include one single pole double throw switch having three contacts of which at least one is a grounding contact and one switch is a single pole single throw switch, the double throw switch makes a connection, in measuring operation, between the measuring line and the measuring voltage terminal, and when the measuring line is taken out of operation, makes a connection between the measuring voltage terminal and ground potential, and the single pole single throw, switch connects the measuring line to ground potential, and is open in measuring operation.

5. Coupling unit according to claim 4, including at least a first, second and third mutually series-connected network protection capacitor for each phase lead, and a plurality of high voltage support insulators, of which the first and second capacitor are arranged on said high voltage support insulators at a higher level than floor level and are connected directly to the generator phase leads and of which the third capacitor is arranged at a level lower than said higher level and is closely spaced from the floor of the respective high voltage cell; the cell having an accessible front side and a boundary grid; said their capacitor being connectible to ground potential via the grounding contact of the double throw switch, the third protection capacitor being supported by means of an insulating material plate; a metallic grounded mounting plate of the coupling unit being mounted on a support structure, the measuring impedance, the overvoltage arrester, the breakdown fuse, the coaxial relay including switching line for actuating the relay and said phase lead being fastened onto said mounting plate.

6. Coupling unit according to claim 5 including an insulating tube and a connecting jack, and wherein the coaxial cable and the switching line are brought through the insulating tube to the connecting jack at the boundary grid on the front side of the high-voltage cell.

* * * * *